US005617296A

United States Patent [19]
Melville et al.

[11] Patent Number: 5,617,296
[45] Date of Patent: Apr. 1, 1997

[54] PRINTED CIRCUIT BOARD COVERS FOR AN ELECTRONICS PACKAGE

[75] Inventors: James A. Melville, Rochester; Roger D. Hamilton, Eyota, both of Minn.

[73] Assignee: International Business Machines Corporation, Armonk, N.Y.

[21] Appl. No.: 443,216

[22] Filed: May 17, 1995

[51] Int. Cl.⁶ ............................... H05K 1/14; H05K 1/11
[52] U.S. Cl. ..................... 361/736; 361/729; 361/752; 361/796; 361/816
[58] Field of Search ........................... 361/728, 729, 361/733, 736, 740, 748, 750, 751, 752, 753, 784, 785, 788, 790, 792, 793, 794, 795, 796, 799, 800, 803, 816, 825, 818; 439/928.1; 174/35 C

[56] References Cited

U.S. PATENT DOCUMENTS

| | | |
|---|---|---|
| 4,821,145 | 4/1989 | Corfits et al. . |
| 4,821,146 | 4/1989 | Behrens et al. ..................... 361/788 |
| 5,040,994 | 8/1991 | Nakamoto et al. .................. 361/737 |
| 5,134,546 | 7/1992 | Izumi et al. . |
| 5,177,324 | 1/1993 | Carr et al. . |
| 5,329,418 | 7/1994 | Tanabe ................................ 361/695 |
| 5,481,437 | 1/1996 | Neumann ............................ 361/796 |

*Primary Examiner*—Leo P. Picard
*Assistant Examiner*—Anthony Dinkins
*Attorney, Agent, or Firm*—Owen J. Gamon; Andrew J. Dillon

[57] ABSTRACT

An electronics package for protective enclosure and connection of the circuit to a system backplane having electromagnetic shielding and enhanced packaging density is provided. The electronics package comprises an enclosure having a first cover and a second cover. Each cover of the enclosure is formed from a multilayer circuit board having an insulating support layer of a selected thickness and of a sufficient rigidity to serve as a protective covering for the electronics package, and a shielding layer formed by a conductive plane of a thickness less than the selected thickness of the insulating support layer. At least one cover of the enclosure is a multilayer circuit board having an electronic circuit formed thereon. The electronics package further comprises a circuit card positioned within the housing and having a connector positioned on the back for mating and connection with the system backplane.

17 Claims, 5 Drawing Sheets

PRINTED CIRCUIT BOARD COVERS FOR AN ELECTRONICS PACKAGE

BACKGROUND OF THE INVENTION

1. Technical Field

The present invention relates in general to a shielded, pluggable, mounting enclosure for printed circuit cards such as used in a computer.

2. Description of the Related Art

As computer systems have become more prevalent in the workplace and in the home, there has become a need to make computer systems more adaptable and interchangeable to allow the customization of a computer system to a particular user's needs. Also, it has become necessary to enable the user to change functions or to add new functions to the computer system. These functions can be provided through software or hardware. When a new hardware function is added to a computer system, the electronics for implementing this function are often contained in a self-contained, pluggable, electronics package.

The electronics package contains a circuit card mounted with a variety of electronic components that implement the required electronic function. For example, the circuit card may provide a processor, expanded memory, an I/O card, or a video card. This circuit card is enclosed by a metal container and is connected to a connector at the back of the electronics package. An electronics package thus constructed is easily configured in a computer system by inserting the package into a provided slot in a "card cage" and engaging the connector at the back of the electronics package with a mating connector on the backplane of the computer system. The computer system backplane provides an appropriate interface for the electronics package to be integrated within the computer system.

Because an electronics package may be inserted and removed from a computer system a number of times, and further since an unskilled user may be inserting and removing the package, the enclosure structure of the electronics package must be sturdy and sufficiently rigid to protect the enclosed circuit card from damage that might be caused by physical manipulation of the electronics package. In addition, it is desirable for the package to have electromagnetic compatibility (EMC) by shielding the circuit card from electromagnetic radiation that may cause interference with the circuit card.

To overcome these problems, the prior art has provided electronics packages having enclosures formed from sheet metal. These metal packages have the strength and durability necessary to protect the circuit cards enclosed, and can form ground planes that shield the circuit card from electromagnetic interference (EMI), as well as reduce the electromagnetic emissions from the electronics package itself.

While the prior art design has been satisfactory, there is an ever increasing number of features and functions being added to various computer systems, requiring a continuous re-design of the prior art circuit cards. These new circuit card designs will necessitate various widths and sizes of electronic packages. However, this re-designing of the package widths requires re-design of the card cage slots that hold the packages and the mating connectors on the backplane. As an alternative to such re-design, future electronic package designs will require increased electronics density within the existing package sizes in order to adhere to the current restrictions on the form factor of the card cage and the maximum number of connectors available on the backplane.

SUMMARY OF THE INVENTION

Therefore, it is an object of the present invention to provide an electronics package having an enclosure being sufficiently rigid to serve as a protective covering for the electronics package.

It is another object of the present invention to provide an electronics package having an enclosure that functions as shielding for EMC.

It is still another object of the present invention to provide an electronics package that substantially increases the electronics packaging density over existing electronic packages.

According to the present invention, an electronics package for protective enclosure and connection of the circuit to a system backplane having electromagnetic shielding and enhanced packaging density is provided. The electronics package comprises an enclosure having a first cover and a second cover. Each cover of the enclosure is formed from a multilayer circuit board having an insulating support layer of a selected thickness and of a sufficient rigidity to serve as a protective covering for the electronics package, and a shielding layer formed by a conductive plane of a thickness less than the selected thickness of the insulating support layer. At least one cover of the enclosure is a multilayer circuit board having an electronic circuit formed thereon. The electronics package further comprises a circuit card positioned within the housing and having a connector positioned for mating and connection with the system backplane.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
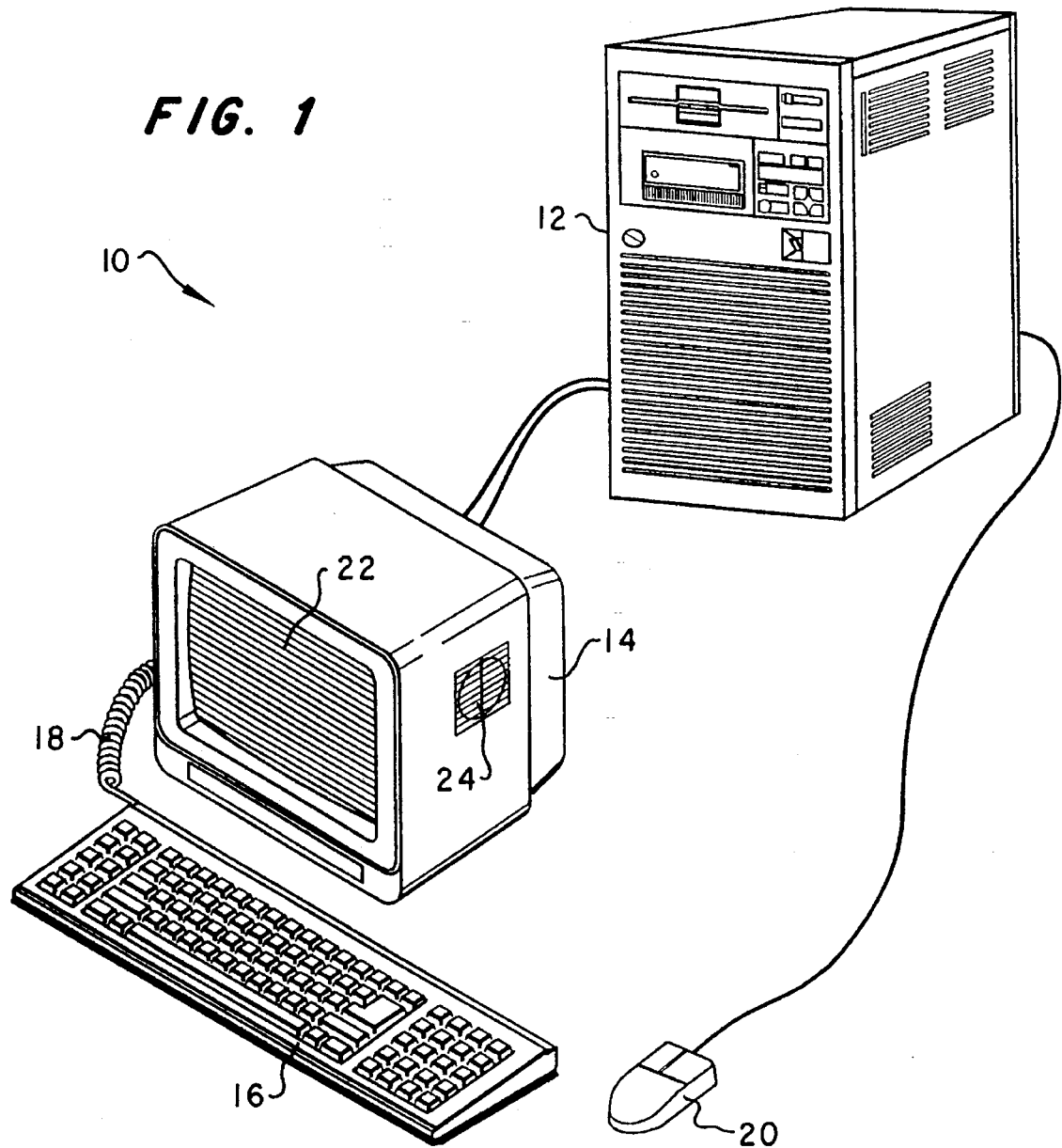
FIG. 1 depicts a data processing system containing electronics, in accordance with the preferred embodiment of the present invention.

With reference now to the figures and in particular with reference to FIG. 1, there is depicted a pictorial representation of a data processing system 10 which may be utilized to implement the method and system of the present invention. As is illustrated, data processing system 10 preferably includes a processor module 12 and a display 14. Keyboard 16 is coupled to processor module 12 and a display 14. Keyboard 16 is coupled to processor module 12 by means of cable 18 in a manner well known in the art. Also coupled to processor module 12 is mouse 20. As depicted, display 14 includes a display screen 22 and a speaker 24. Those skilled in the art will appreciate that data processing system 10 may be implemented utilizing an enhanced mid-range computer, or a so-called personal computer. However, the preferred embodiment utilizes an enhanced mid-range computer sold under the trademark "AS/400" by International Business Machines Corporation.

Figure 2:
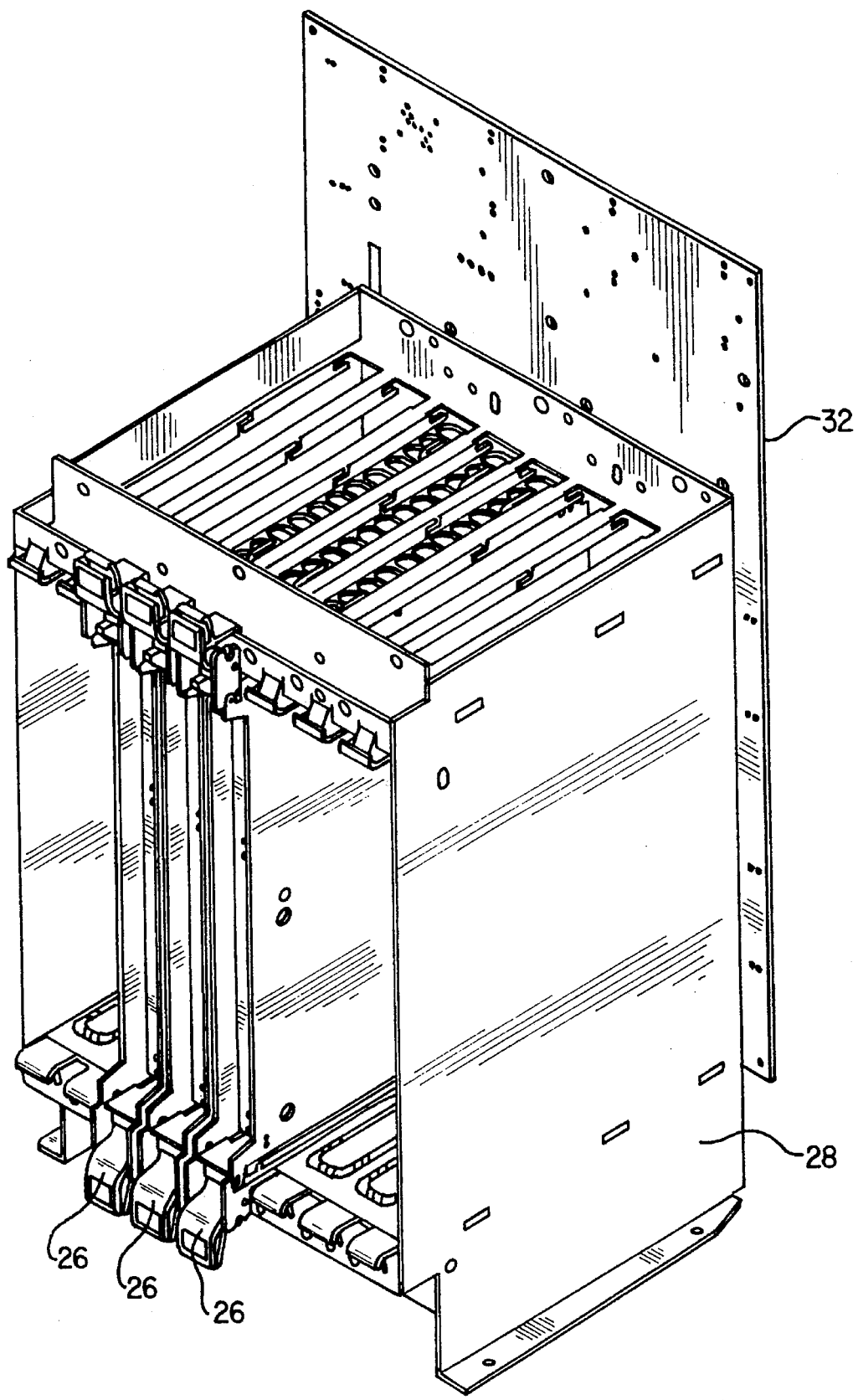
FIG. 2 shows a plurality of electronics packages mounted within a card cage and connected to the backplane of a data processing system, in accordance with the preferred embodiment of the present invention.

Referring now to FIG. 2, there is shown a plurality of electronics packages 26 inserted within card cage 28, which is mounted within processor module 12. Each electronics package 26 includes a connector 30 (not shown) coupled to a mating connector in backplane 32. Backplane 32 provides electrical power to each of the electronics packages 26 and forms a communications medium between the electronics packages 26, as well as with the remainder of processor module 12.

Figure 3:
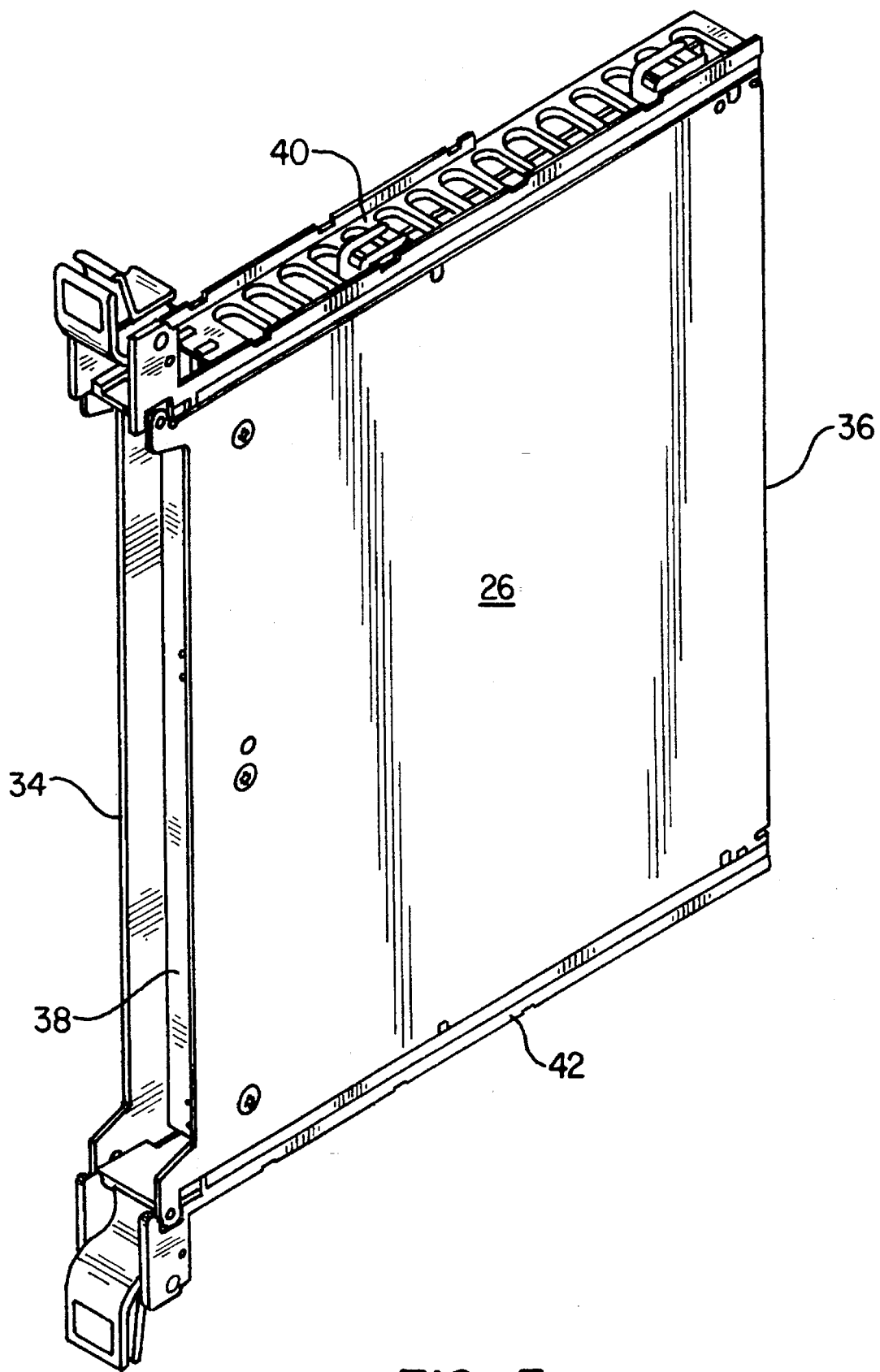
FIG. 3 shows a perspective view from the back of an electronics package, in accordance with the preferred embodiment of the present invention.

FIG. 3 shows a rear perspective view of an electronics package of a preferred embodiment of the present invention. Package 26 has an enclosure formed by a left cover 34, a right cover 36 and a back 38. The enclosure is completed by brackets 40 and 42, which hold the covers 34, 36 fixedly spaced from each other.

Figure 4:
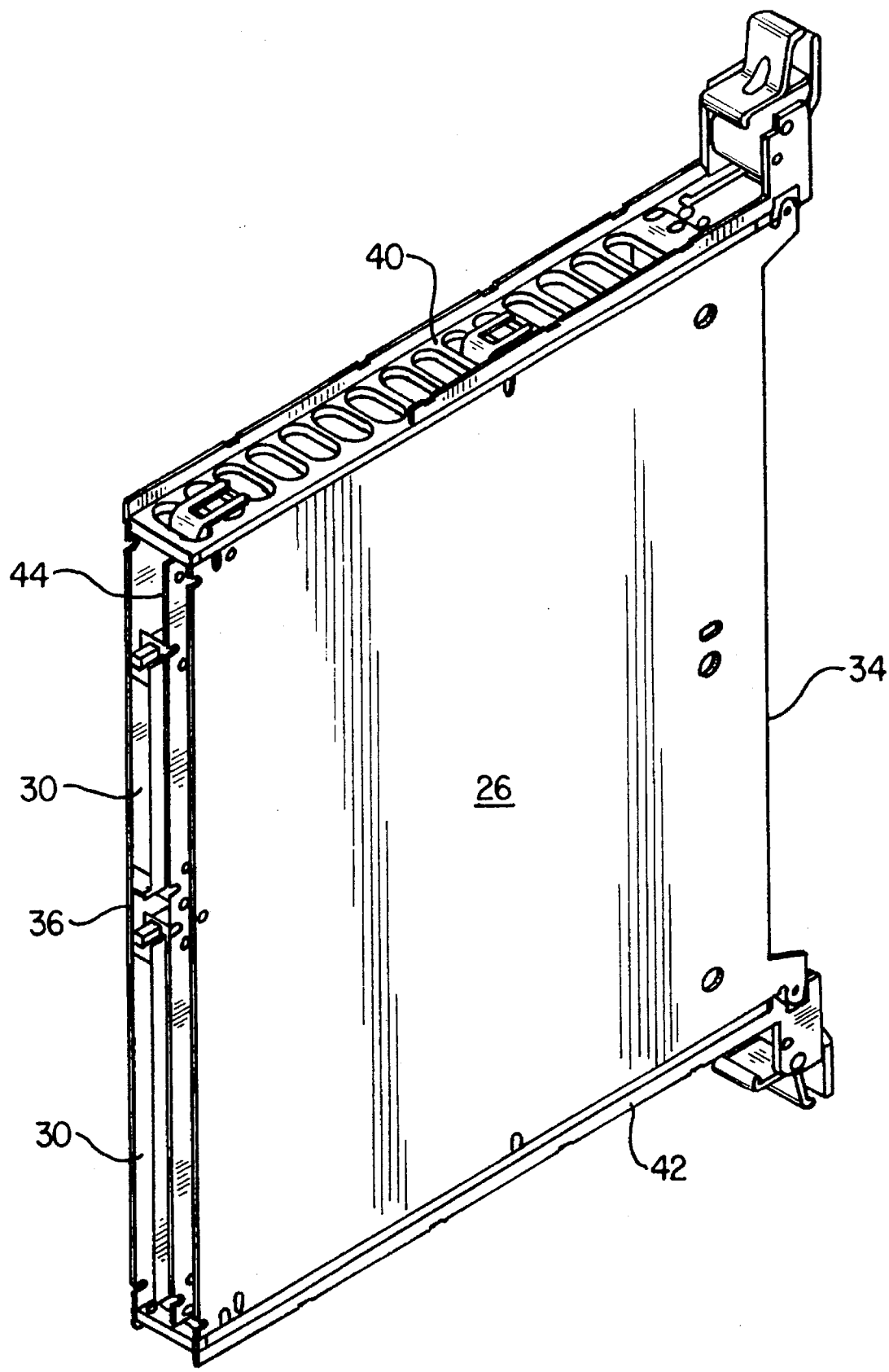
FIG. 4 shows a perspective view from the front of an electronics package, in accordance with the preferred embodiment of the present invention.

FIG. 4 shows a front perspective of the electronics package of the present invention. Enclosed within package 26 is circuit card 44. Typically, such a circuit card would be a printed circuit board (PCB), as is well known by those skilled in the art, and would contain processor circuitry or memory expansion for a small computer, for example. Mounted on the edge of circuit card 44 are two connectors 30 positioned on the back for mating and connection with a system backplane when electronics package 26 is inserted into a card cage.

Figure 5:
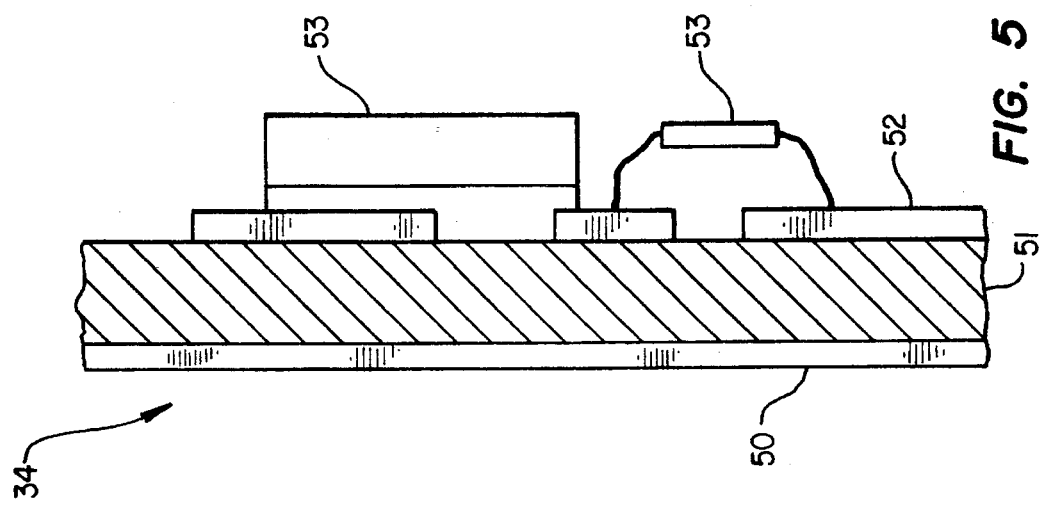
FIG. 5 shows a cross-sectional view of a side cover of the electronics package, in accordance with the preferred embodiment of the present invention.

According to the present invention, the covers 34, 36 are formed from a multilayer circuit board material. In a preferred embodiment, as shown in Figure 5, the circuit board material is a double-sided rigid circuit board having an inner insulating support layer 51 of reinforced plastic formed between two metal layers. The insulating support layer 51 must be made of a strong plastic sufficiently rigid and strong to support the enclosure structure of the package and to withstand minor impacts from objects without damage being caused to the circuit card contained within. As an example, the insulating support layer could be formed from the reinforced plastic FR-4 produced by Polyclad Laminates, Inc. and having a thickness of 1.72 mm.

Insulating layer 51 is covered on each side by thin conductive layers 50 and 52. These metal layers 50, 52 can be formed by depositing or laminating thin sheets of copper onto the reinforced plastic. Conductive layer 50 is formed of a thin sheet of metal, such as copper, which is substantially thinner than the thickness of the insulating support layer 51. In accordance with the present invention, as will be described in detail below, conductive layer 52 is formed of a thin layer of metal, similar to conductive layer 50, and has been etched to form conductive traces comprising an electrical circuit. Mounted on the conductive layer 52 are electrical components 53, which form part of the electrical circuit through connection with the traces of conductive layer 52.

As will be appreciated by those skilled in the art, conductive layer 50 forms a conductive plane that covers an entire side of the electronics package. Grounding conductive layer 50 allows it to act as a shield against electromagnetic radiation. Forming an electromagnetic shield on each of the covers 34, 36 makes the electronics package 26 electromagnetic compatible (EMC) and protects any circuitry contained in the package, including the circuit card, from EMI.

Figure 6:
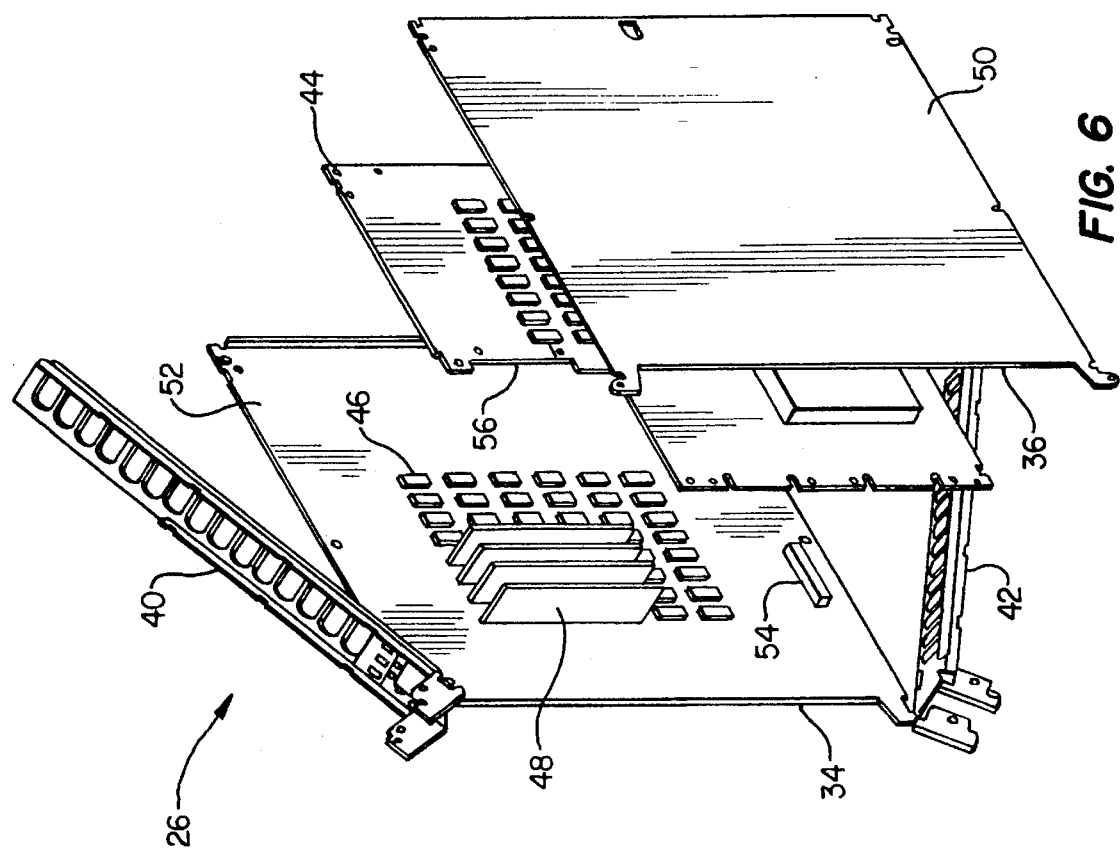
FIG. 6 shows an exploded view of the electronics package, in accordance with the preferred embodiment of the present invention.

Referring now to FIG. 6, there is shown an exploded view of the electronics package, in accordance with a preferred embodiment of the present invention. In this exploded view of electronics package 26, the back side 38 and connector 30 are not shown. Enclosed within the enclosure formed by covers 34, 36, brackets 40, 42 and back side 38 is circuit card 44.

In accordance with the preferred embodiment of the present invention, the copper layer 52 on the insides of covers 34, 36 are etched using an etching process as is known by those skilled in the art to form electrical connections on the cover. A plurality of electronic components 46, 48 are mounted to the metal layer 52 on cover 34. These electrical components, which may include integrated circuits, transistors, resisters, capacitors, etc., are interconnected by the electrical traces on metal layer 52 to be incorporated into the electrical circuit formed on cover 34, as will be appreciated by those skilled in the art. In a similar manner, an electrical circuit may be formed on the inside conductive layer 52 of cover 36 by etching metal traces in the metal layer and mounting electrical components thereon. Therefore, according to the present invention, the use of the multilayer printed circuit board for one or both of the covers of an electronics package provides two additional internal surfaces for mounting components and circuits, resulting in a much denser electronics package that can be designed to occupy the same external dimensions as existing electronic package assemblies.

As seen in FIG. 6, the I/O connector 54 can provide a direct connection between the circuit formed on cover 34 and circuit card 44, or the circuit on cover 36, or both. Alternatively, I/O connector 54 can be cabled directly to connector 30, or even the backplane itself. Thus, each of the circuit boards 34, 36 and 44 can be interconnected within the package form factor with connectors, cables, or cross over cards. This feature overcomes the packaging limitations arising from insufficient backplane connectors or electronic package slots in the card cage.

In order to further facilitate the compactness of the package, high components on the circuit card can be arranged to face low components on the facing cover surface for maximum utilization of space within any package. In addition, according to a preferred embodiment of the present invention, very tall components can be mounted on an inside cover surface and span the entire width of the electronics package. To enable this embodiment, open portions must be cut in the circuit card where the electronic components may extend through. For example, the top left corner of circuit card 44 as shown in FIG. 6 has a removed section 56 through which the tall electronic components 48 will extend when the enclosure is constructed.

Although the present invention is described with a double-sided PCB construction, it will be appreciated by those skilled in the art that the multilayered circuit board covers may be constructed using any number or type of insulating and conductive layers. Moreover, the order of the conductive layers and insulating layers relative to each other may be altered from the preferred embodiment without deviating from the intended scope of the present invention. For example, the multilayered circuit board covers may be formed by an innerconductive layer covered on each side by an insulating support layer, or may be formed by any multiple of layers beyond the three layers of conductive and insulating layers as has been described in the preferred embodiment.

As was described, the ever increasing quantities of electronics required to provide new functions to existing computers has forced a reduction in the functionality available in the prior art because the wider electronic packages required have reduced the number of slots available for other packages. If prior art devices were not to lose functionality, the computer's card cage and backplane would have to be completely redesigned to accommodate the wider electronics packages.

As will be appreciated by the those skilled in the art, the electronics package of the present invention overcomes these problems with the prior art by providing an electronics package having enhanced packaging density. This allows the package to remain relatively thin and sized to fit in card slots of existing computer systems. Consequently, functionality can be enhanced by the electronics package without requiring a re-design of the computer system. In fact, for any given width of an electronics package, the utilization of the present invention for mounting additional circuitry on the multilayered circuit board covers will increase the electronics package density and flexibility. As an additional advantage, a metal shielding layer can easily be formed on the outside of the multilayered circuit board to make the electronics package of the present invention electromagnetic compatible.

While the invention has been particularly shown and described with reference to a preferred embodiment, it will be understood by those skilled in the art that various changes in form and detail may be made therein without departing from the spirit and scope of the invention.

What is claimed is:

1. A data processing system comprising:
    a processor module;
    a system backplane contained in the processor module; and
    a plurality of electronics packages for enclosure and connection of circuits to the system backplane, wherein each electronic package comprises:
        an enclosure having a first side and a second side, wherein each side is formed from a multilayer circuit board having an insulating support layer of a selected thickness, and
        a circuit card positioned within the enclosure having a connector positioned on the back that is connected with the system backplane, wherein the circuit card has open portions where electronic components mounted to at least one of the sides extend through.

2. A data processing system according to claim 1, wherein at least one side comprises a multilayer circuit board having a shielding layer formed by a conductive plane that is of a thickness less than the selected thickness of the insulating support layer.

3. A data processing system according to claim 2, wherein the conductive plane is an outer layer of the multilayer circuit board.

4. A data processing system according to claim 1, wherein at least one side comprises a multilayer circuit board having an electronic circuit.

5. A data processing system according to claim 4, wherein the electronic circuit includes electronic components affixed to the multilayer circuit board.

6. A data processing system according to claim 4, wherein the electronic circuit connects to the connector.

7. A data processing system according to claim 4, wherein the electronic circuit connects to the circuit card.

8. A data processing system according to claim 1, wherein at least one side comprises a multilayer circuit board formed from layers of reinforced plastic and copper.

9. A data processing system according to claim 1, wherein at least one side has an insulating layer between a shielding layer and a layer having an electronic circuit.

10. An electronics package for enclosure and connection of a circuit to a system backplane, comprising:
    an enclosure having a first side and a second side, wherein each side is formed from a multilayer circuit board having an insulating support layer of a selected thickness and of a sufficient rigidity to serve as a protective covering for the electronics package, and a shielding layer formed by a conductive plane that is of a thickness less than the selected thickness of the insulating support layer, wherein at least one side has an electronic circuit layer including electronic components affixed to the electronic circuit layer; and
    a circuit card positioned within the enclosure having a connector positioned on the back for mating and connection with a system backplane, wherein the circuit card has open portions where the electronic components extend through.

11. An electronics package according to claim 10, wherein the electronic circuit connects to the connector.

12. An electronics package for enclosure and connection of a circuit to a system backplane, comprising:
    an enclosure having a first side and a second side, wherein each side is formed from a multilayer circuit board having an insulating support layer of a selected thickness, and a shielding layer formed by a conductive plane, and wherein at least one side comprises a multilayer circuit board having an electronic circuit; and
    a circuit card positioned within the enclosure having a connector positioned on the back for mating and connection with a system backplane, wherein the circuit card has open portions where electronic components in the electronic circuit extend through.

13. An electronics package according to claim 12, wherein the conductive plane is an outer layer of the multilayer circuit board.

14. An electronics package according to claim 12, wherein the electronic circuit includes electronic components affixed to the multilayer circuit board.

15. An electronics package according to claim 12, wherein the electronic circuit connects to the connector.

16. An electronics package according to claim 12, wherein the electronic circuit connects to the circuit card.

17. An electronics package according to claim 12, wherein at least one side comprises a multilayer circuit board formed from layers of reinforced plastic and copper.

* * * * *